United States Patent [19]
Parekh et al.

[11] Patent Number: 6,005,268
[45] Date of Patent: Dec. 21, 1999

[54] INTEGRATED CIRCUITRY, DRAM CELLS, CAPACITORS, AND METHODS OF FORMING INTEGRATED CIRCUITRY, DRAM CELLS AND CAPACITORS

[75] Inventors: Kunal R. Parekh; Angela S. Parekh, both of Boise, Id.

[73] Assignee: Micron Technology, Inc., Boise, Id.

[21] Appl. No.: 08/884,925

[22] Filed: Jun. 30, 1997

Related U.S. Application Data

[62] Division of application No. 08/799,492, Feb. 11, 1997.

[51] Int. Cl.$^6$ .......................... H01L 27/108; H01L 29/76; H01L 29/94; H01L 31/119
[52] U.S. Cl. ............................................. 257/296; 257/303
[58] Field of Search ..................................... 257/296, 303

[56] References Cited

U.S. PATENT DOCUMENTS

| | | |
|---|---|---|
| 5,294,561 | 3/1994 | Tanigawa . |
| 5,318,927 | 6/1994 | Sandhu et al. . |
| 5,391,511 | 2/1995 | Doan et al. . |
| 5,401,681 | 3/1995 | Dennison . |
| 5,438,011 | 8/1995 | Blalock et al. . |
| 5,547,888 | 8/1996 | Yamazaki . |
| 5,563,089 | 10/1996 | Jost et al. . |
| 5,565,372 | 10/1996 | Kim . |
| 5,567,640 | 10/1996 | Tseng . |
| 5,604,147 | 2/1997 | Fischer et al. . |
| 5,605,857 | 2/1997 | Jost et al. . |
| 5,627,095 | 5/1997 | Koh et al. ............................... 438/672 |
| 5,661,064 | 8/1997 | Figura et al. . |
| 5,677,222 | 10/1997 | Tseng . |
| 5,686,337 | 11/1997 | Koh et al. . |
| 5,686,339 | 11/1997 | Lee et al. . |
| 5,688,713 | 11/1997 | Linlui et al. . |
| 5,712,202 | 1/1998 | Liaw et al. ............................... 438/253 |
| 5,786,249 | 7/1998 | Dennison ................................ 438/241 |
| 5,796,135 | 8/1998 | Liang et al. . |

Primary Examiner—Stephen D. Meier
Attorney, Agent, or Firm—Wells, St. John, Roberts, Gregory & Matkin P.S.

[57] ABSTRACT

The invention includes a number of methods and structures pertaining to integrated circuitry. The invention encompasses a method of forming an integrated circuit comprising: a) forming an insulative material layer over a first node location and a second node location, the insulative material layer having an uppermost surface; and b) forming first and second conductive pedestals extending through the insulative material layer and in electrical connection with the first and second node locations, the conductive pedestals comprising exposed uppermost surfaces which are above the uppermost surface of the insulative material layer. The invention also encompasses an integrated circuit comprising: a) a first node location and a second node location within a semiconductor substrate; b) a transistor gate electrically connecting the first and second node locations; c) an insulative material layer over the semiconductor substrate, the insulative material layer comprising an uppermost surface; d) a first conductive pedestal extending through the insulative material layer and in electrical connection with the first node location; e) a second conductive pedestal extending through the insulative material layer and in electrical connection with the second node location; f) the conductive pedestals comprising uppermost surfaces which are at a common elevational height relative to one another and are above the uppermost surface of the insulative material layer in a region proximate the pedestals.

9 Claims, 18 Drawing Sheets

INTEGRATED CIRCUITRY, DRAM CELLS, CAPACITORS, AND METHODS OF FORMING INTEGRATED CIRCUITRY, DRAM CELLS AND CAPACITORS

RELATED PATENT DATA

This patent resulted from a divisional application of U.S. patent application Ser. No. 08/799,492 filed Feb. 11, 1997 titled "Integrated Circuitry, DRAM Cells, Capacitors, And Methods Of Forming Integrated Circuitry, DRAM Cells And Capacitors" and listing Kunal R. Parekh and Angela S. Parekh as inventors.

TECHNICAL FIELD

This invention pertains to integrated circuitry and to methods of forming integrated circuitry. The invention is thought to have particular significance in application to methods of forming dynamic random access memory (DRAM) cell structures, to DRAM cell structures.

BACKGROUND OF THE INVENTION

A commonly used semiconductor memory device is a DRAM cell. A DRAM cell generally consists of a capacitor coupled through a transistor to a bitline. A continuous challenge in the semiconductor industry is to increase DRAM circuit density. Accordingly, there is a continuous effort to decrease the size of memory cell components.

Another continuous trend in the semiconductor industry is to minimize processing steps. Accordingly, it is desirable to utilize common steps for the formation of separate DRAM components. For instance, it is desirable to utilize common steps for the formation of the DRAM capacitor structures and the DRAM bitline contacts.

A semiconductor wafer fragment 10 is illustrated in FIG. 1 showing a prior art DRAM array 83. Wafer fragment 10 comprises a semiconductive material 12, field oxide regions 14, and wordlines 24 and 26. Wordlines 24 and 26 comprise a gate oxide layer 16, a polysilicon layer 18, a silicide layer 20 and a silicon oxide layer 22. Silicide layer 20 comprises a refractory metal silicide, such as tungsten silicide, and polysilicon layer 18 typically comprises polysilicon doped with a conductivity enhancing dopant. Nitride spacers 30 are laterally adjacent wordlines 24 and 26.

Electrical node locations 25, 27 and 29 are between wordlines 24 and 26 and are electrically connected by transistor gates comprised by wordlines 24 and 26. Node locations 25, 27 and 29 are diffusion regions formed within semiconductive material 12.

A borophosphosilicate glass (BPSG) layer 34 is over semiconductive material 12 and wordlines 24 and 26. An oxide layer 32 is provided between BPSG layer 34 and material 12. Oxide layer 32 inhibits diffusion of phosphorus from BPSG layer 34 into underlying materials.

Conductive pedestals 54, 55 and 56 extend through BPSG layer 34 to node locations 25, 27 and 29, respectively. Capacitor constructions 62 and 64 contact upper surfaces of pedestals 54 and 55, respectively. Capacitor constructions 62 and 64 comprise a storage node layer 66, a dielectric layer 68, and a cell plate layer 70. Dielectric layer 68 comprises an electrically insulative layer, such as silicon nitride. Cell plate layer 70 comprises conductively doped polysilicon, and may alternatively be referred to as a cell layer 70. Storage node layer 66 comprises conductively doped hemispherical grain polysilicon.

A conductive bitline plug 75 contacts an upper surface of pedestal 55. Bitline plug 75 may comprise, for example, tungsten. Together, bitline plug 75 and pedestal 55 comprise a bitline contact 77.

A bitline 76 extends over capacitors 62 and 64 and in electrical connection with bitline contact 77. Bitline 76 may comprise, for example, aluminum.

The capacitors 62 and 64 are electrically connected to bitline contact 77 through transistor gates comprised by wordlines 26. A first DRAM cell 79 comprises capacitor 62 electrically connected to bitline 76 through a wordline 26 and bitline contact 77. A second DRAM cell 81 comprises capacitor 64 electrically connected to bitline 76 through wordline a 26 and bitline contact 77. DRAM array 83 comprises first and second DRAM cells 79 and 81.

SUMMARY OF THE INVENTION

The invention includes a number of methods and structures pertaining to integrated circuit technology, including: methods of forming DRAM memory cell constructions; methods of forming capacitor constructions; methods of forming capacitor and bitline constructions; DRAM memory cell constructions; and capacitor constructions.

The invention encompasses a method of forming an integrated circuit wherein an insulative material layer having an uppermost surface is formed over a first node location and a second node location, and wherein first and second conductive pedestals are formed extending through the insulative material layer and in electrical connection with the first and second node locations, respectively. The conductive pedestals has exposed uppermost surfaces above the uppermost surface of the insulative material layer.

The invention also encompasses an integrated circuit which includes a first node location and a second node location within a semiconductor substrate, the first and second node locations being connectable through a transistor gate and being under an insulative material which has an uppermost surface. The integrated circuit further includes a first conductive pedestal extending through the insulative material layer and in electrical connection with the first node location and a second conductive pedestal extending through the insulative material layer and in electrical connection with the second node location, the conductive pedestals having uppermost surfaces which are substantially at a common elevational height relative to one another and which are above the uppermost surface of the insulative material layer.

BRIEF DESCRIPTION OF THE DRAWINGS

Preferred embodiments of the invention are described below with reference to the following accompanying drawings.

FIG. 13 is a view of the FIG. 2 wafer fragment at a processing step subsequent to that of FIG. 12.

FIG. 14 is a view of the FIG. 2 wafer fragment at a processing step subsequent to that of FIG. 13.

DETAILED DESCRIPTION OF THE PREFERRED EMBODIMENTS

This disclosure of the invention is submitted in furtherance of tile constitutional purposes of the U.S. Patent Laws "to promote the progress of science and useful arts" (Article 1, Section 8).

A method of forming a DRAM cell of the present invention is is described with reference to FIGS. 2–18. In describing tile method, like numerals from the preceding discussion of the prior art are utilized where appropriate, with differences being indicated by the suffix "a" or with different numerals.

Figure 1:
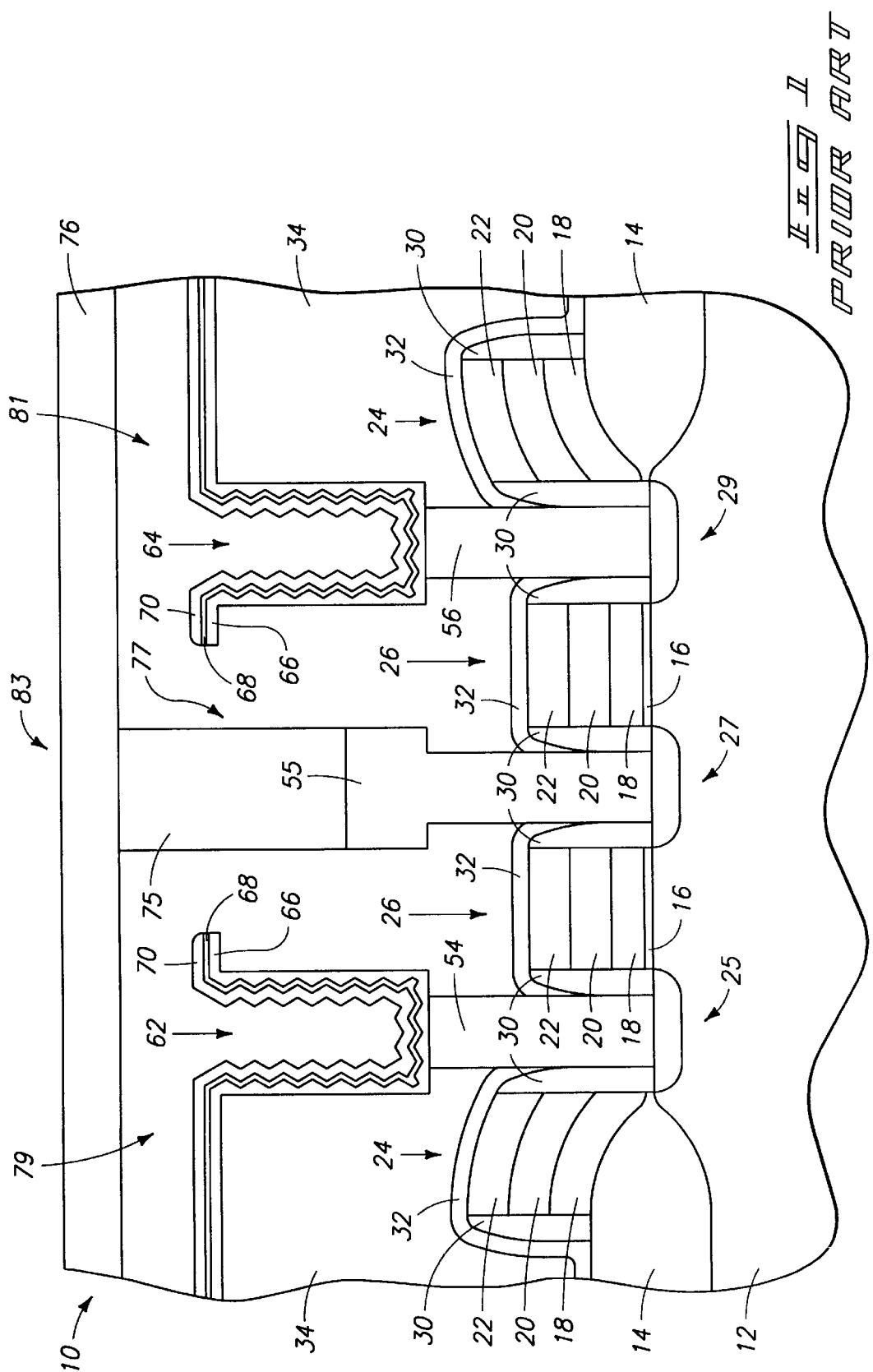
FIG. 1 is a schematic cross-sectional view of a semiconductor wafer fragment comprising a prior art DRAM cell.
Figure 2:
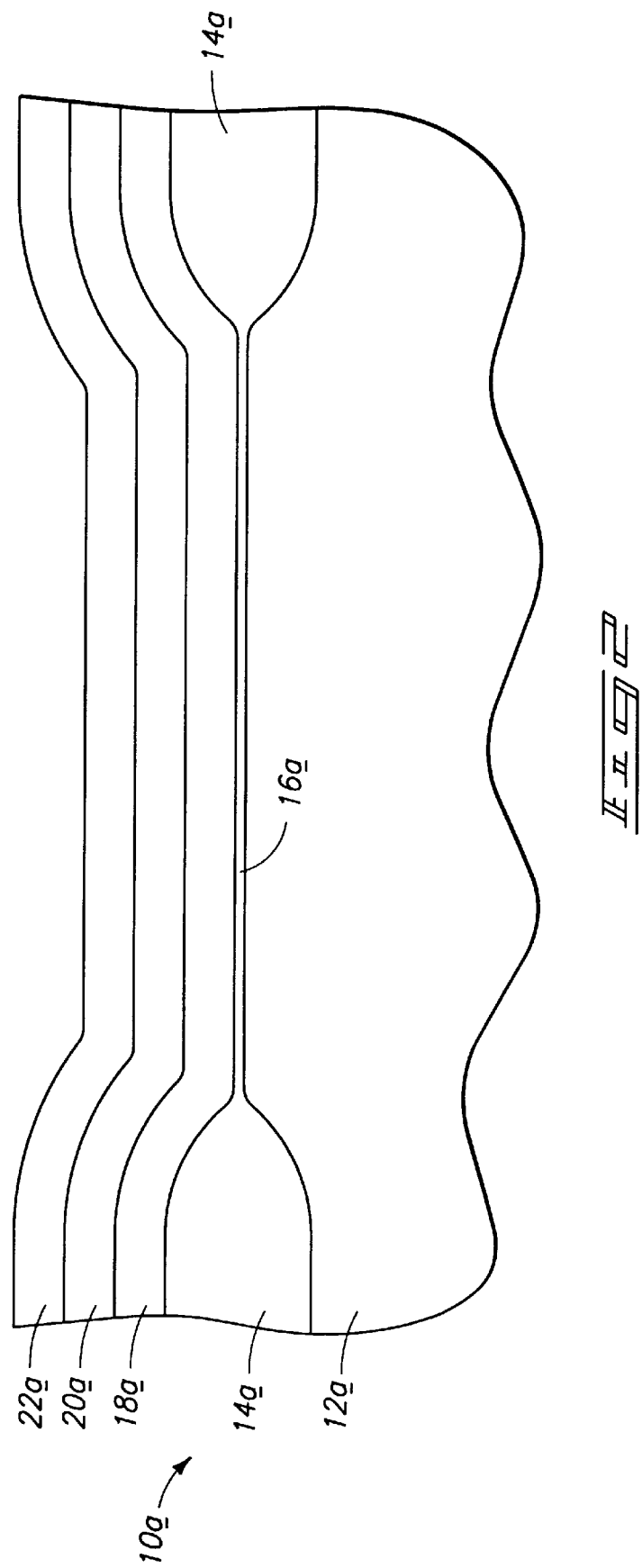
FIG. 2 is a schematic cross-sectional process view of a semiconductor wafer fragment at preliminary processing step of a processing method of the present invention.

Referring to FIG. 2, a semiconductor wafer fragment 10a is illustrated at a preliminary step of the present invention. Wafer fragment 10a comprises a semiconductive material 12a, field oxide regions 14a, and a thin gate oxide layer 16a. Over gate oxide layer 16a is formed polysilicon layer 18a, silicide layer 20a and silicon oxide layer 22a. Silicide layer 20a comprises a refractory metal silicide, such as tungsten silicide, and polysilicon layer 18a typically comprises polysilicon doped with a conductivity enhancing dopant. Layers 16a, 18a, 20a and 22a can be formed by conventional methods.

Figure 3:
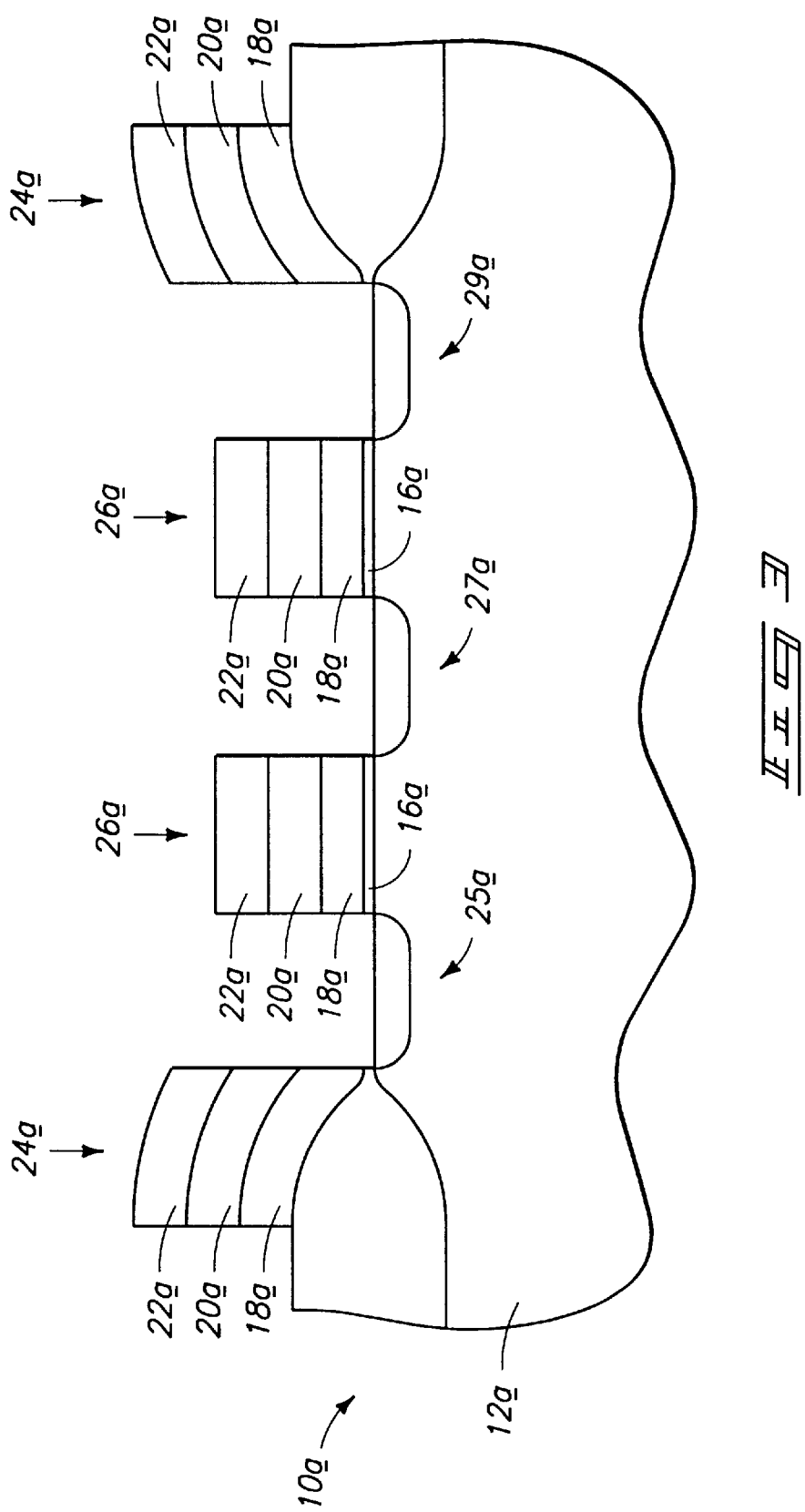
FIG. 3 is a view of the FIG. 2 wafer fragment at a processing step subsequent to that of FIG. 2.

Referring next to FIG. 3, polysilicon layer 18a, silicide layer 20a and silicon oxide layer 22a are etched to form wordlines 24a and 26a. Such etching can be accomplished by conventional methods. Between wordlines 24a and 26a are defined electrical node locations 25a, 27a and 29a, with wordlines 26a comprising transistor gates which electrically connect node locations 25a, 27a, and 29a. Node locations 25a, 27a and 29a are typically diffusion regions formed within semiconductive material 12a by ion implanting conductivity enhancing dopant into the material 12a. Such ion implanting may occur after patterning wordlines 24a and 26a, utilizing wordlines 24a and 26a as masks. Alternatively, the diffusion regions may be formed prior to deposition of one or more of layers 18a, 20a and 22a (shown in FIG. 2). In yet other alternative methods, the diffusion regions may be formed after formation of doped polysilicon pedestals (such as the pedestals 136, 138 and 140 shown in FIG. 12, and to be described subsequently) by out-diffusion of conductivity enhancing dopant from the pedestals.

For the above-discussed reasons, defined electrical node locations 25a, 27a, and 29a need not be electrically conductive at the preliminary step of FIG. 3. Node locations 25a, 27a and 29a could be conductive at the step of FIG. 3 if formed by ion implanting of dopant into semiconductive material 12a. On the other hand, node locations 25a, 27a and 29a may be substantially nonconductive at the preliminary step of FIG. 3 in, for example, embodiments in which node locations 25a, 27a and 29a are ultimately doped by out-diffusion of dopant from a conductively doped pedestal, such as the pedestals of FIG. 12.

Figure 4:
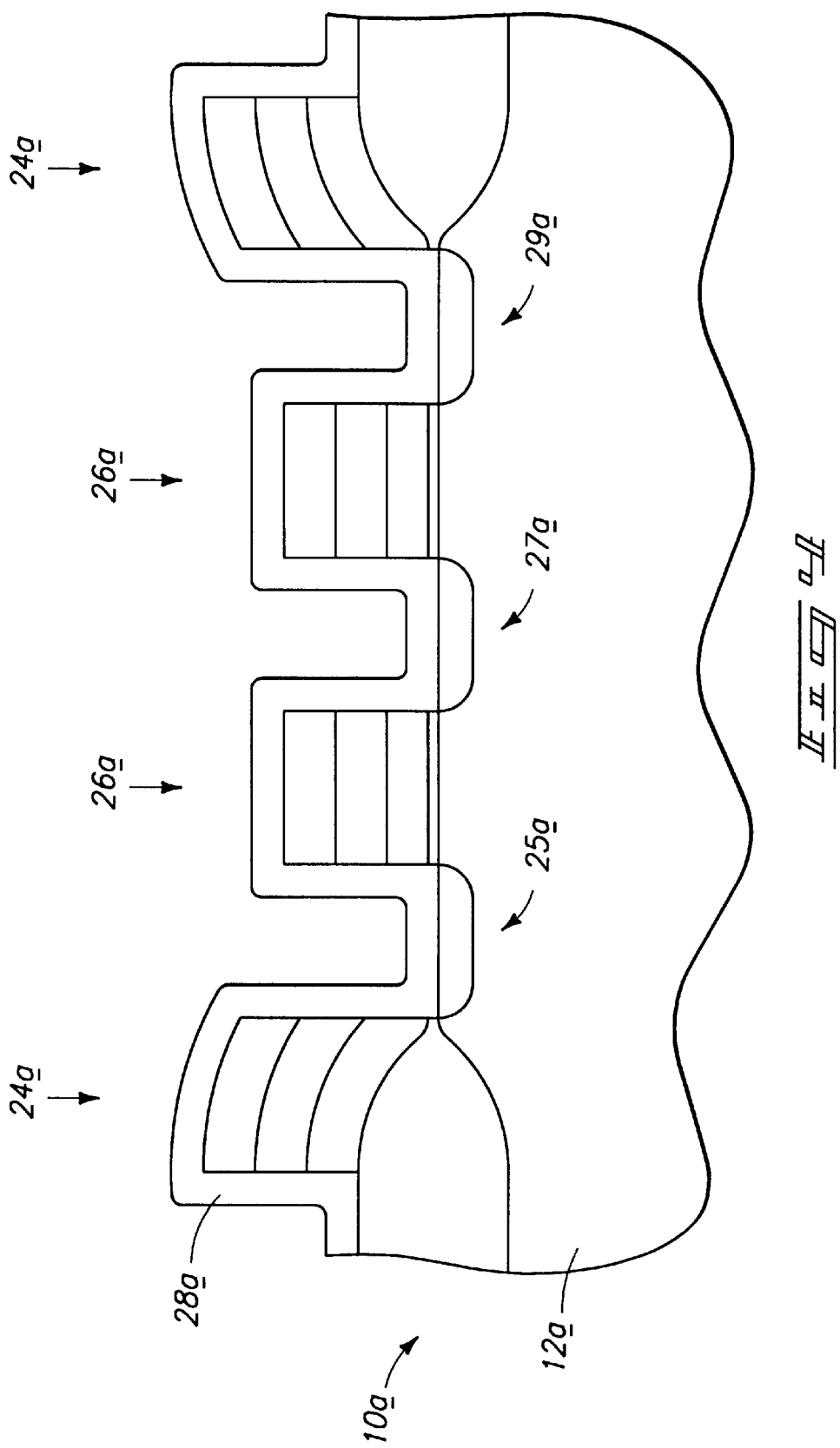
FIG. 4 is a view of the FIG. 2 wafer fragment at a processing step subsequent to that of FIG. 3.
Figure 5:
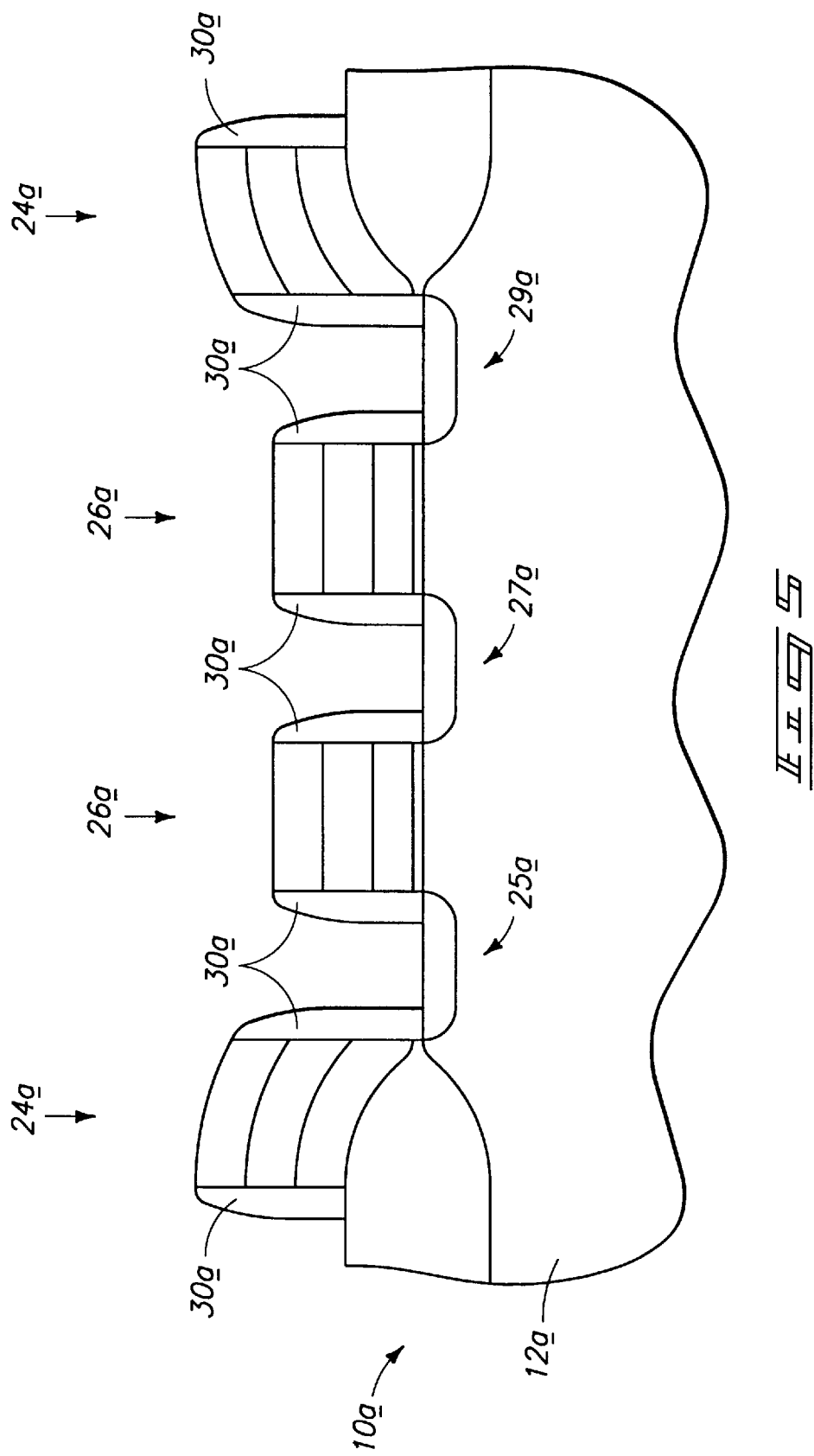
FIG. 5 is a view of the FIG. 2 wafer fragment at a processing step subsequent to that of FIG. 4.

Referring to FIGS. 4 and 5, a nitride layer 28a is provided over wordlines 24a and 26a, and subsequently etched to form nitride spacers 30a laterally adjacent wordlines 24a and 26a.

Figure 6:
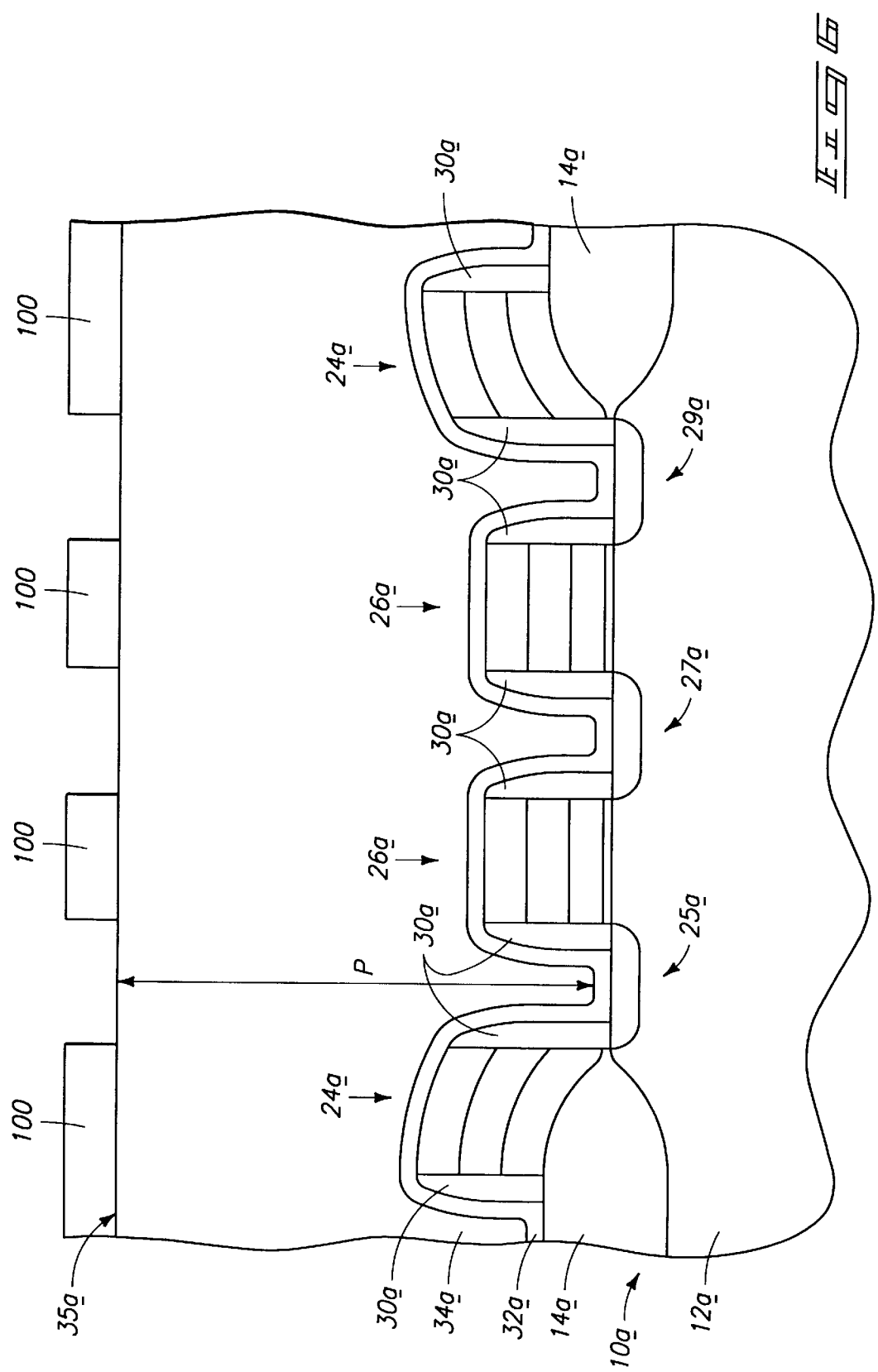
FIG. 6 is a view of the FIG. 2 wafer fragment at a processing step subsequent to that of FIG. 5.

Referring to FIG. 6, an overlying oxide layer 32a is provided over wordlines 24a and 26a, and a BPSG layer 34a is provided over oxide layer 32a. Overlying oxide layer 32a is typically about 500 Angstroms thick, and BPSG layer 34a is typically about 14,000 Angstroms thick.

BPSG layer 34a is planarized, for example, by chemical-mechanical polishing to form a planar upper surface 35a. After the planarization, insulative layer 34a comprises a thickness "P" over the node locations which is preferably about 15,000 Angstroms. A patterned masking layer 100, preferably comprising photoresist, is formed over upper surface 35a.

Figure 7:
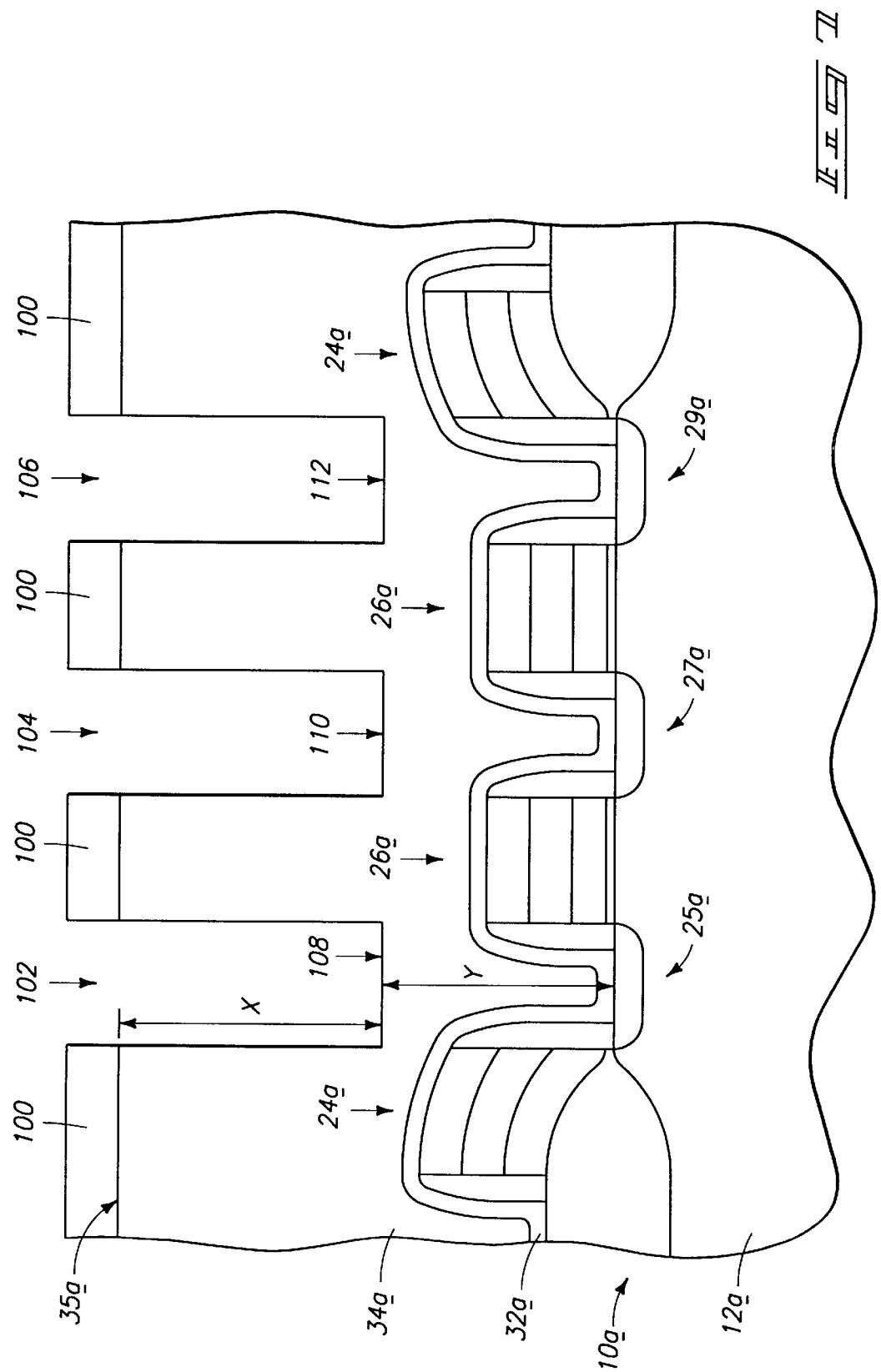
FIG. 7 is a view of the FIG. 2 wafer fragment at a processing step subsequent to that of FIG. 6.

Referring to FIG. 7, an anisotropic oxide etch is conducted to form openings 102, 104 and 106 extending into insulative layer 34. Openings 102, 104 and 106 may be referred to as first, second and third openings, respectively. Openings 102, 104 and 106 are over node locations 25a, 27a and 29a, respectively, but do not extend entirely to node locations 25a, 27a and 29a. Instead, openings 102, 104 and 106 comprise bases 108, 110 and 112, respectively, which are above node locations 25a, 27a and 29a by a distance "Y". Preferably, depth "X" is greater than thickness "X". Accordingly, depth "X" is preferably greater than one-half of the original thickness "P" (shown in FIG. 6) of insulative layer 34. As discussed below with reference to FIG. 10, such preferred relative depths of "X" and "Y" permit a blanket etch to extend openings 102, 104 and 106 to node locations 25a, 27a and 29a without removing layer 34a from over wordlines 24a or 26a. A preferred depth "X" is from about 7500 Angstroms to about 10,000 Angstroms, and a preferred distance "Y" is from about 5000 Angstroms to about 7500 Angstroms.

Figure 8:
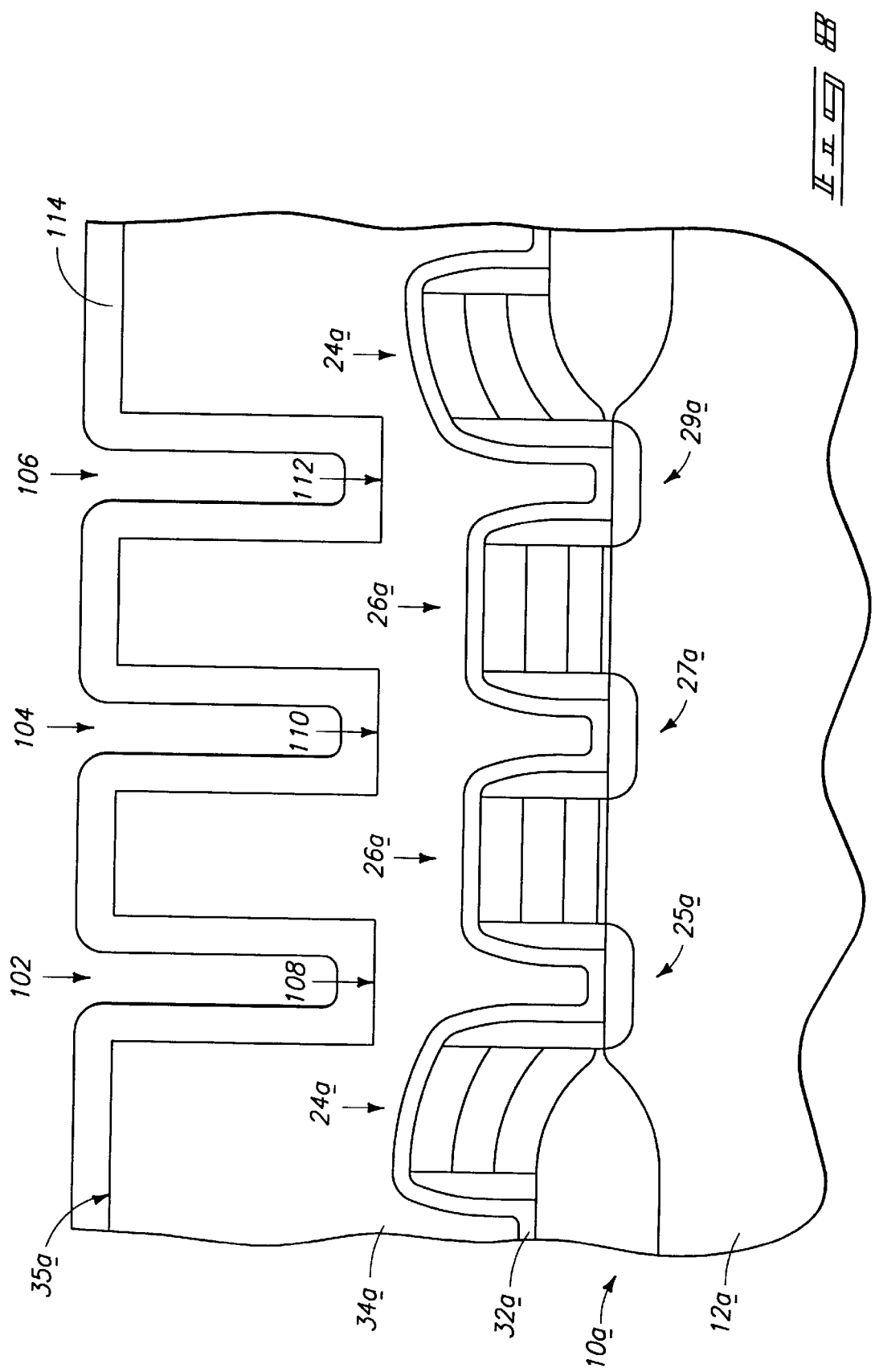
FIG. 8 is a view of the FIG. 2 wafer fragment at a processing step subsequent to that of FIG. 7.

Referring to FIG. 8, photoresist layer 100 (shown in FIG. 7) is removed. Subsequently, a spacer material layer 114 is provided offer upper surface 35a of insulative material 34a and within openings 102, 104 and 106. Layer 114 is provided to a thickness which conformably deposits a layer in openings 102, 104 and 106 and thereby narrows openings 102, 104 and 106.

Layer 114 preferably comprises an insulative material, and may comprise, for example, silicon dioxide or silicon nitride. Layer 114 is preferably formed to a thickness which will narrow a cross-sectional dimension of openings 102, 104 and 106 by about a factor of three. For instance, if openings 102, 104 and 106 comprise a circular shape along a horizontal cross-section, layer 114 will preferably narrow a diameter of the circular shape by about a factor of three. Methods for depositing layer 114 are known to persons of skill in the art, and may comprise, for example, chemical vapor deposition utilizing tetraethylorthosilicate (TEOS).

Figure 9:
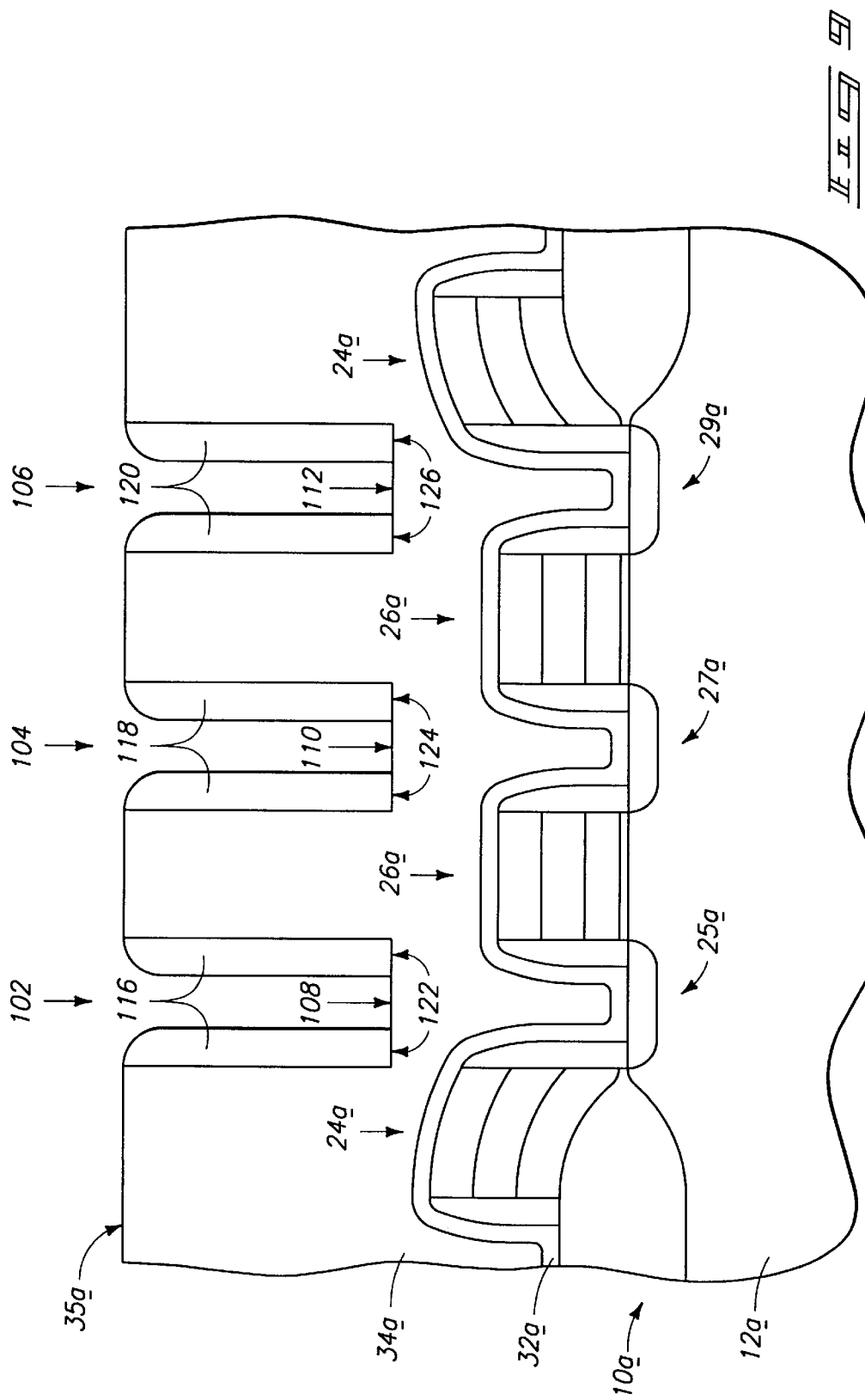
FIG. 9 is a view of the FIG. 2 wafer fragment at a processing step subsequent to that of FIG. 8.

Referring to FIG. 9, spacer material 114 (shown in FIG. 8) is anisotropically etched to form spacers 116, 118 and 120 within openings 102, 104 and 106, respectively. Spacers 116, 118 and 120 rest upon bases 108, 110 and 112 of openings 102, 104 and 106, respectively, and comprise bottom surfaces 122, 124 and 126, which are above node locations 25a, 27a, and 29a.

Spacers 116, 118 and 120 appear discontinuous in the shown cross-sectional view of FIG. 9. However, the spacers are preferably not discontinuous. Instead, spacers 116, 118 and 120 preferably extend entirely around inner peripheries of openings 102, 104 and 106 respectively.

Figure 10:
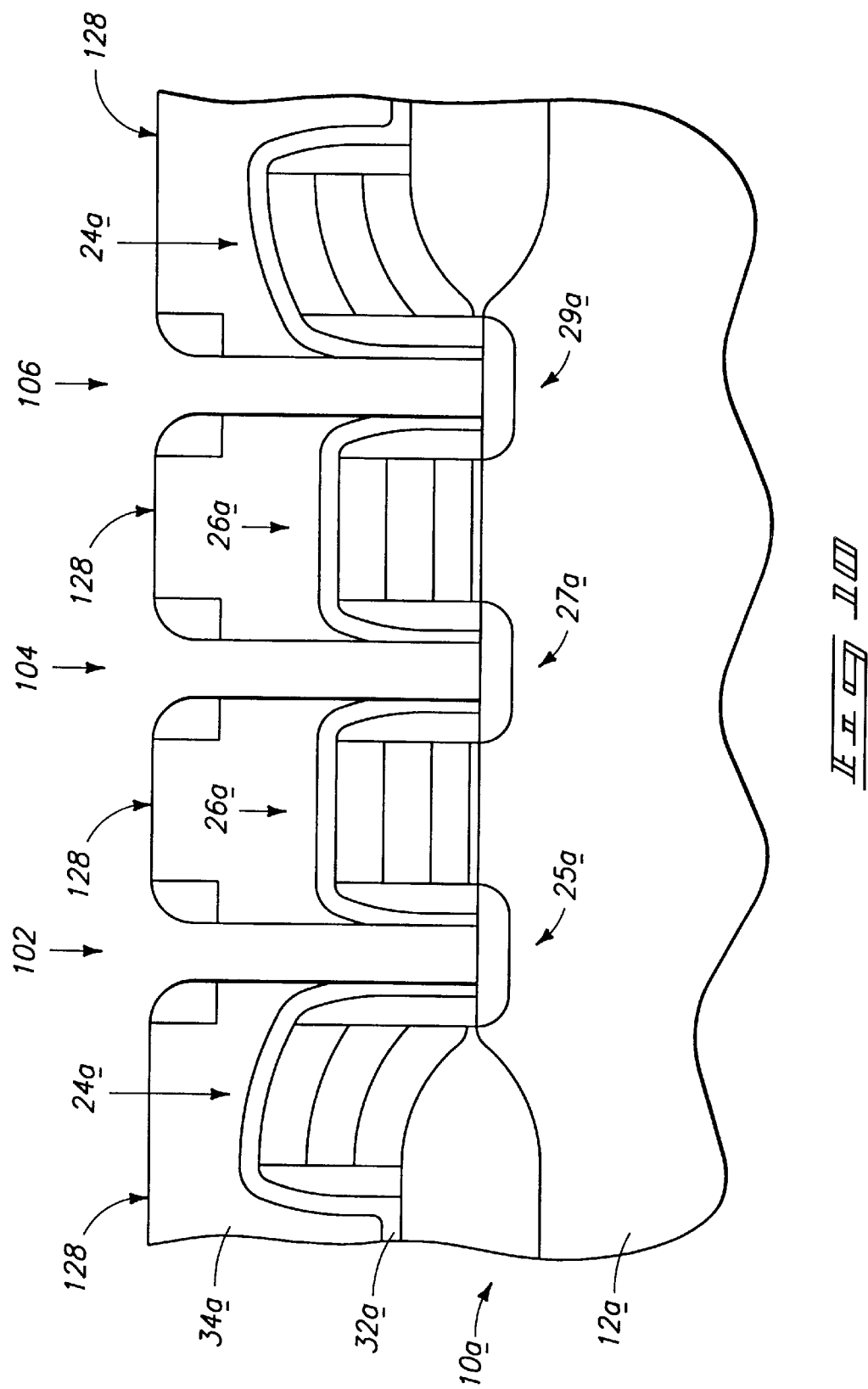
FIG. 10 is a view of the FIG. 2 wafer fragment at a processing step subsequent to that of FIG. 9.

Referring to FIG. 10, a blanket oxide etch is conducted to extend narrowed openings 102, 104 and 106 to node locations 25a, 27a and 29a respectively. The blanket oxide etch also removes insulative layer 34a adjacent openings 102, 104 and 106, and thus forms a new upper surface 128 of layer 34a. Upper surface 128 is below an elevational height of previous upper surface 35a (shown in FIG. 9) of insulative material 34a. The blanket oxide etch will preferably comprise an anisotropic oxide etch. Methods for conducting such anisotropic oxide etch are known to persons of ordinary skill in the art. The preferred relative distances of "X" (shown in FIG. 7) and "Y" (shown in FIG. 7), discussed above with reference to FIG. 7, enable the blanket etch to extend openings 102, 104 and 106 to node locations 25a, 27a and 29a before layer 34a is etched from over wordlines 24a or 26a.

Figure 11:
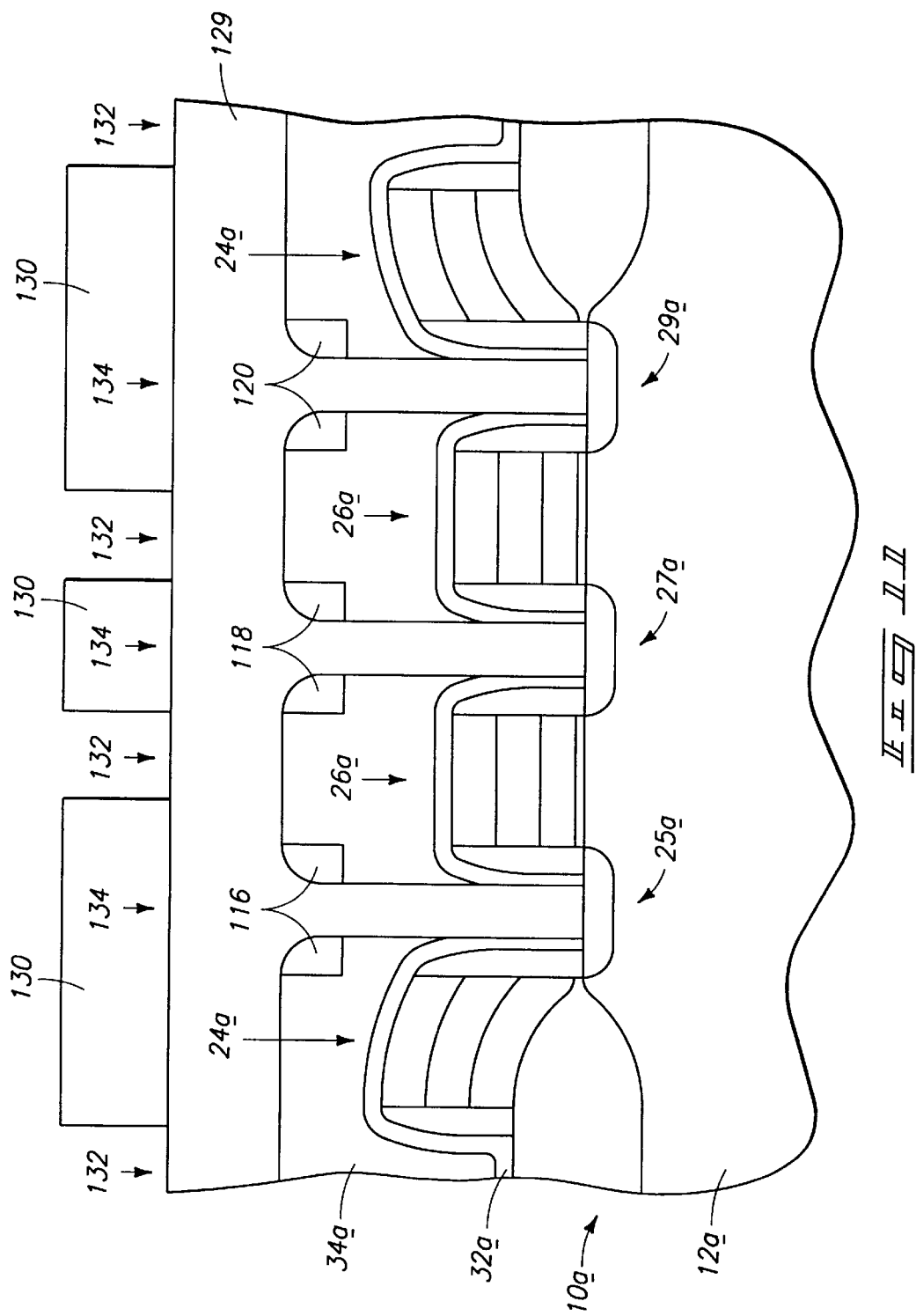
FIG. 11 is a view of the FIG. 2 wafer fragment at a processing is step subsequent to that of FIG. 10.

Referring to FIG. 11, a conductive material layer 129 is provided over insulative material 34a and within openings 102, 104, and 106. Conductive material layer 129 is preferably provided to a thickness of about 12,000 Angstroms, which fills openings 102, 104 and 106. Conductive layer 129 can be formed, for example, by depositing conductively doped polysilicon. An alternative example method of forming conductive layer 129 comprises alternating doped and substantially undoped layers of polysilicon and subsequently distributing dopant throughout the alternating polysilicon layers with a thermal treatment step. To aid in interpretation of this specification and the claims that follow, a doped polysilicon layer is defined as a polysilicon layer comprising greater than about $1 \times 10^{19}$ atoms/cm$^3$ of dopant and a substantially undoped polysilicon layer is defined as a polysilicon layer comprising less than about $1 \times 10^{19}$ atoms/cm$^3$ of dopant. Preferably, a substantially undoped polysilicon layer will have about 0 atoms/cm$^3$ of dopant.

An example method for forming and thermally treating alternating doped and substantially undoped polysilicon layers is as follows. First, a lower conductively doped polysilicon layer is formed to a thickness of about 2,000 Angstroms. Second, a substantially undoped polysilicon latter is formed to a thickness of about 9,000 Angstroms over the lower doped polysilicon layer. Third, an upper doped polysilicon layer is formed to a thickness of about 1,000 Angstroms over the substantially undoped polysilicon layer. Fourth, the alternating doped and undoped polysilicon layers are heated to a temperature of about 1000° C. for a time of greater than about 20 seconds to distribute the conductivity enhancing dopant throughout the alternating polysilicon layers. Preferably, such heating involves a rapid thermal process (RTP) wherein the temperature of the polysilicon layers is ramped to 1000° C. at a rate of greater than 25° C./second.

After formation of conductive layer 129, a patterned masking layer 130, preferably comprising photoresist, is provided to form exposed portions 132 and masked portions 134 of material 129.

Figure 12:
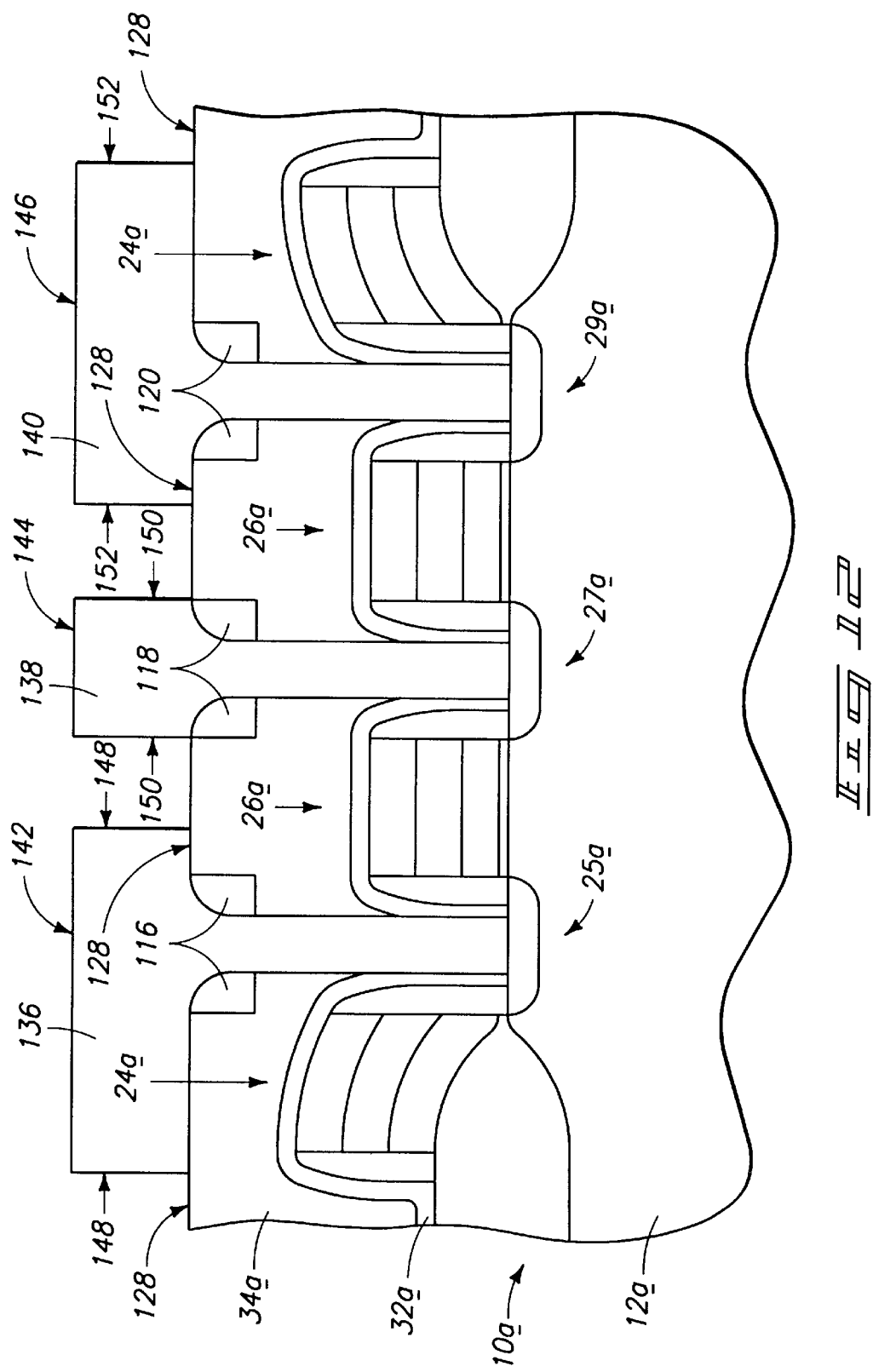
FIG. 12 is a view of the FIG. 2 wafer fragment at a processing step subsequent to that of FIG. 11.
Figure 11:
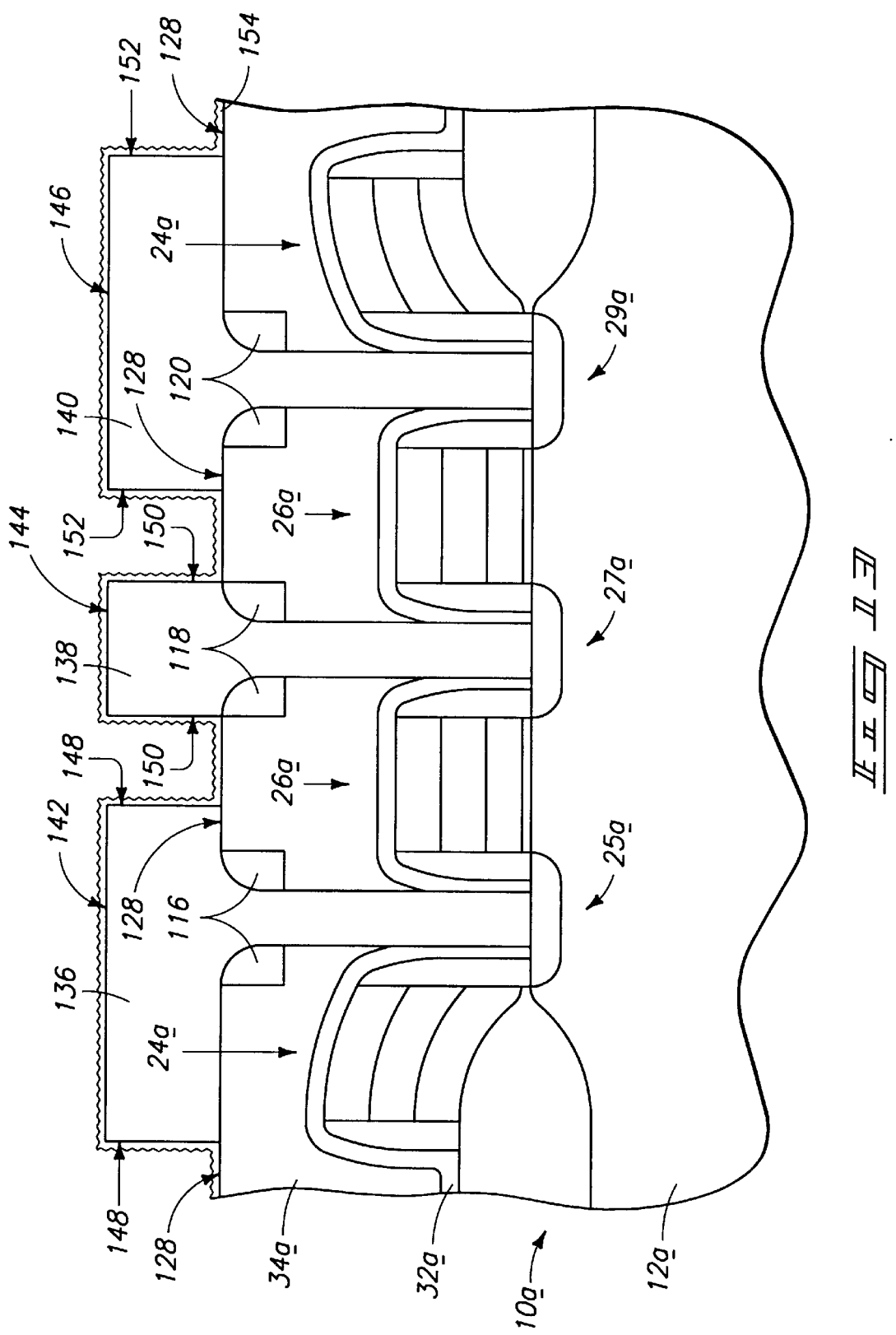
Figure 11:
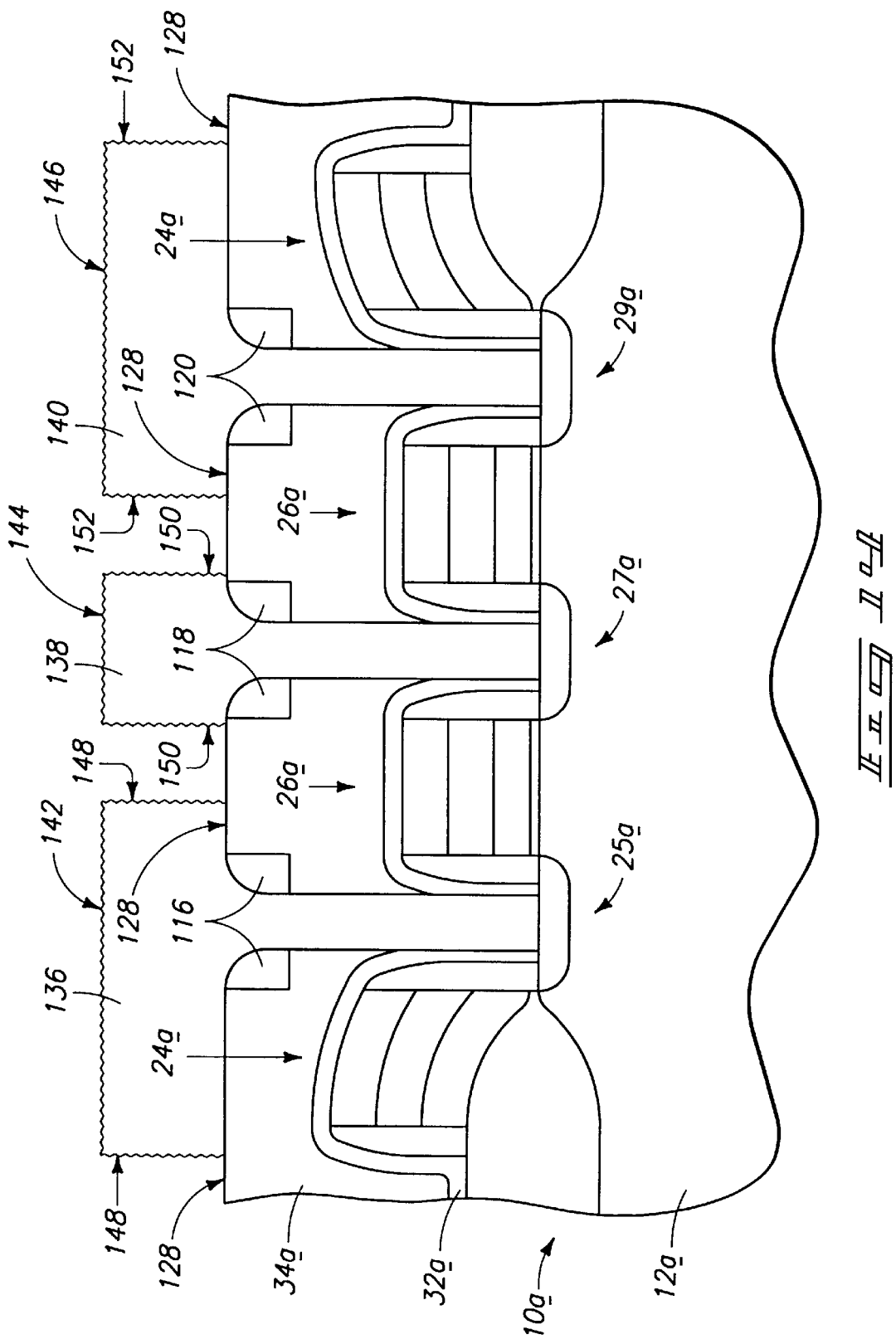

Referring to FIG. 12, exposed portions 132 of material 129 (shown in FIG. 11) are removed to form isolated conductive pedestals 136, 138 and 140. Pedestals 136, 138 and 140 comprise uppermost surfaces 142, 144 and 146, respectively, and comprise exposed lateral surfaces 148, 150 and 152, respectively. Uppermost surfaces 142, 144 and 146 are all above upper surface 128 of insulative material 34a in the illustrated region about conductive pedestals 136, 138 and 140. Also, as the exposed uppermost surfaces 142, 144 and 146 were formed from a common conductive layer 128 (shown in FIG. 11), uppermost surfaces 142, 144 and 146 are at a substantially common elevational height relative to one another.

The etch to form isolated conductive pedestals 136, 138 and 140 preferably comprises an etch selective to the material of layer 129 (shown in FIG. 11) relative to the material of insulative layer 34a and relative to the material of spacers 116, 118 and 120. An example etch for the preferred condition in which conductive material 129 comprises conductively doped polysilicon, insulative material 34a comprises BPS(G, and spacers 116, 118 and 120 comprise silicon dioxide, comprises an anisotropic dry polysilicon etch utilizing $Cl_2$, or $Cl_2/N_2$.

As discussed previously, conductive layer 129 (shown in FIG. 11) may comprise alternating layers of doped and undoped polysilicon, and the dopant can be distributed throughout the layers with a subsequent thermal treatment step. Such thermal treatment step can occur either before or after the formation and isolation of pedestals 136, 138 and 140.

Referring to FIG. 13, a storage node layer 154 is formed over insulative layer 34a, over exposed lateral surfaces 148, 150 and 152, and over uppermost surfaces 142, 144 and 146 of conductive pedestals 136, 138 and 140. Storage node layer 154 preferably comprises a rugged polysilicon layer, and most preferably comprises at least one material selected from the group consisting of cylindrical grain polysilicon and hemispherical grain polysilicon. The cylindrical grain polysilicon and/or hemispherical grain polysilicon create a surface roughness of storage node layer 154. Storage node layer 154 may be formed by conventional methods.

Referring to FIG. 14, storage node layer 154 (shown in FIG. 13) is subjected to an isotropic polysilicon etch. Such isotropic polysilicon etch transfers surface roughness from storage node layer 154 to lateral surfaces 148, 150 and 152, and uppermost surfaces 142, 144 and 146 of conductive pedestals 136, 138 and 140. The isotropic etch also isolates pedestals 136, 138 and 140 by removing storage node layer 154 from between pedestals 136, 138 and 140. The isotropic etch may, in embodiments which are not shown, transfer surface roughness from storage node layer 154 to upper surface 128 of insulative layer 34a.

Figure 15:
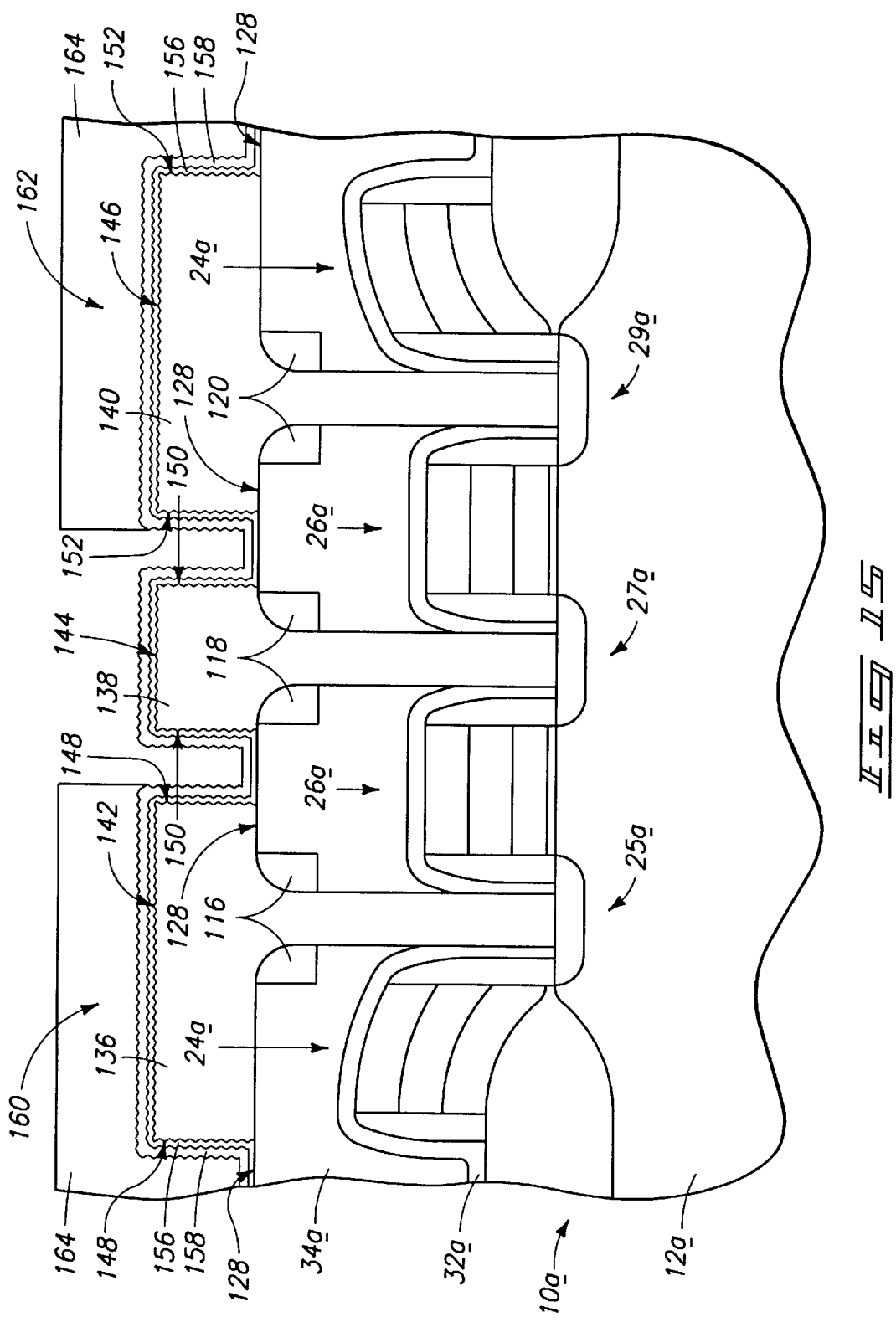
FIG. 15 is a view of the FIG. 2 wafer fragment at a processing step subsequent to that of FIG. 14.

Referring to FIG. 15, a dielectric layer 156 and a cell plate layer 158 are formed over and between conductive pedestals 136, 138 and 140. Specifically, dielectric layer 156 and cell plate layer 158 extend over lateral surfaces 148, 150 and 152, and over uppermost surfaces 142, 144 and 146 of pedestals 136, 138 and 140.

Dielectric layer 156 typically comprises an electrically insulative layer, such as silicon nitride or a composite of silicon nitride and silicon oxide. Cell plate layer 158 typically comprises an electrically conductive layer, such as conductively doped polysilicon. Dielectric layer 156 and cell plate layer 158 may be formed by conventional methods.

Pedestal 136, together with dielectric layer 156 and capacitor 158 comprises a first capacitor construction 160. Pedestal 140, together with dielectric layer 156 and cell plate layer 158 comprises a second capacitor construction 162. A patterned masking layer 164, preferably comprising photoresist, is formed over first and second capacitor construction 160 and 162. Patterned masking layer 164 masks first arid second capacitor constructions 160 and 162 while leaving portions of cell plate layer 158 and dielectric layer 156 exposed between capacitor constructions 160 and 162.

Figure 16:
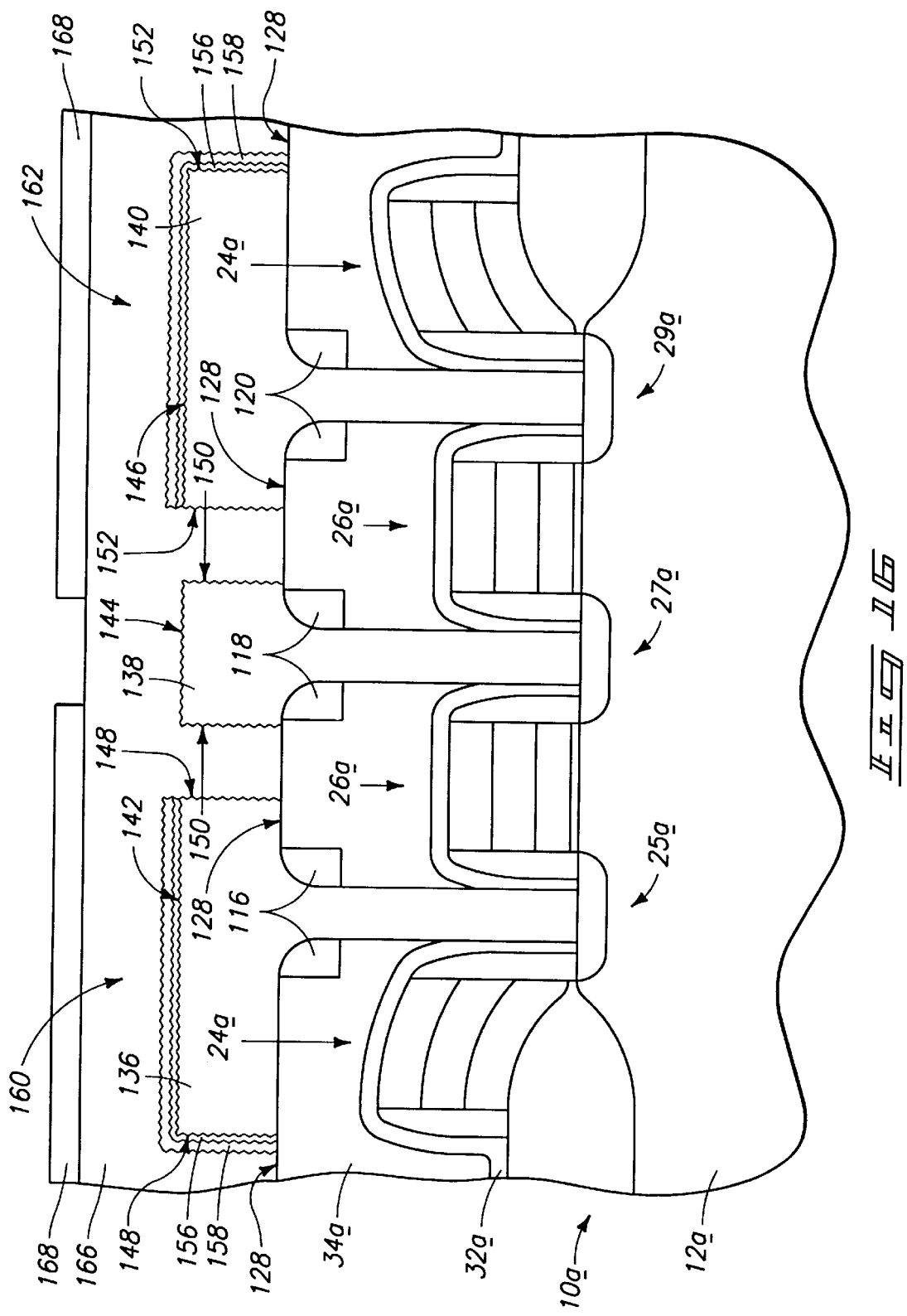
FIG. 16 is a view of the FIG. 2 wafer fragment at a processing step subsequent to that of FIG. 15.

Referring to FIG. 16, an isotropic etch is conducted to remove the exposed portions of cell plate layer 158 and dielectric layer 156. Removal of cell plate layer 158 electrically isolates pedestal 138 from capacitor constructions 160 and 162.

After such electrical isolation of pedestal 138, an insulative layer 166 is formed over capacitors 160 and 162, and over pedestal 138. Insulative layer 166 may comprise, for example, BPSG. A patterned masking layer 168, preferably comprising photoresist, is formed over insulative layer 166 to mask portions of insulator 166 over capacitor constructions 160 and 162, and to leave a portion of insulative layer 166 exposed over pedestal 138.

Figure 17:
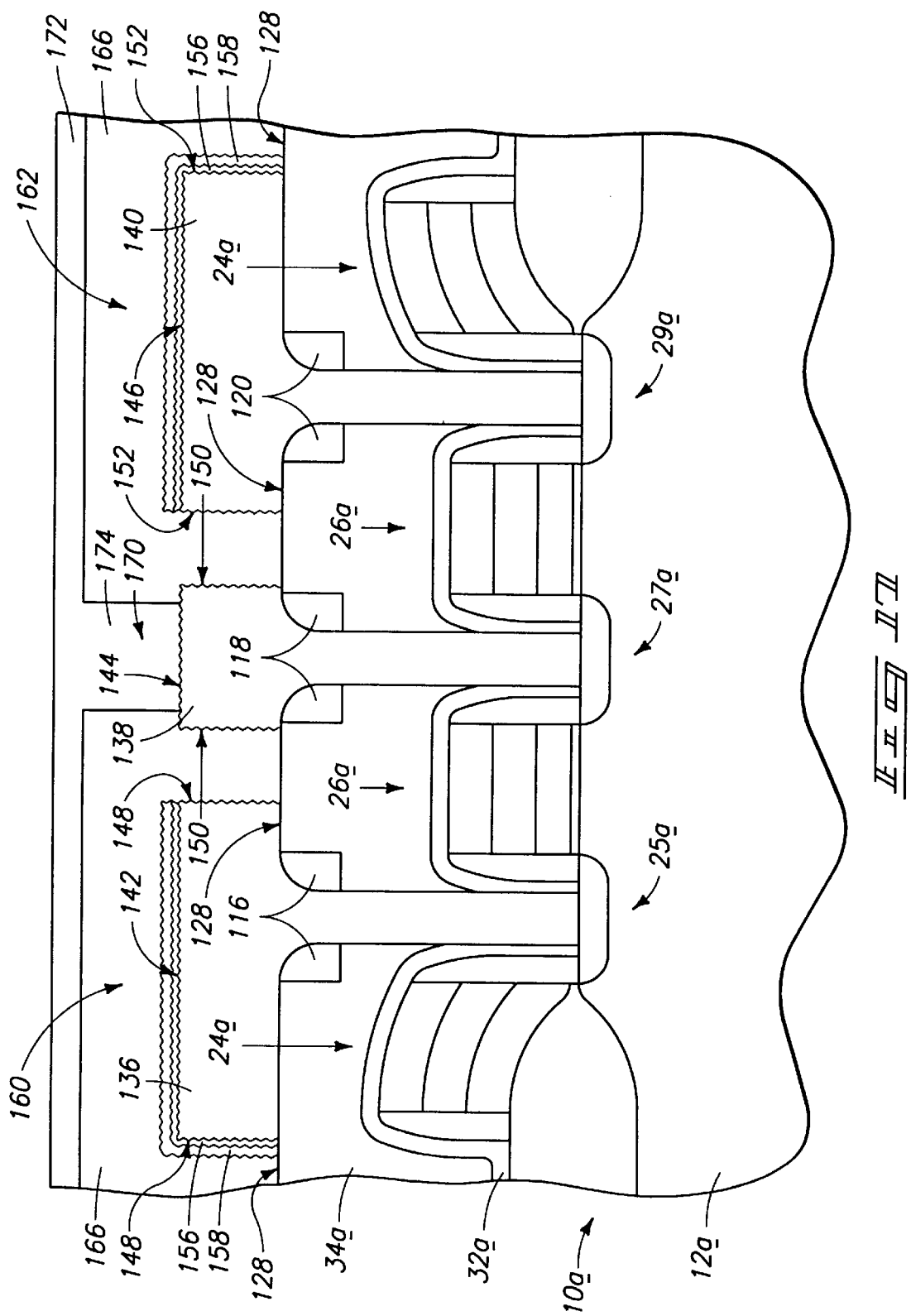
FIG. 17 is a view of the FIG. 2 wafer fragment at a processing step subsequent to that of FIG. 16.

Referring to FIG. 17, the exposed portion of insulative layer 166 over pedestal 138 is removed to form a bitline plug opening 170 extending through insulative layer 166 to pedestal 138. Bitline plug opening 170 exposes uppermost surface 144 of pedestal 138.

A bitline plug layer 172 is provided over insulative material 166 and within bitline plug opening 170 to electrically contact the exposed uppermost surface 144 of pedestal 138. A portion of bitline plug layer 172 within opening 170 forms a bitline plug 174. Bitline plug layer 172 may comprise a number of materials known to persons of ordinary skill in the art, including, for example, tungsten.

Figure 18:
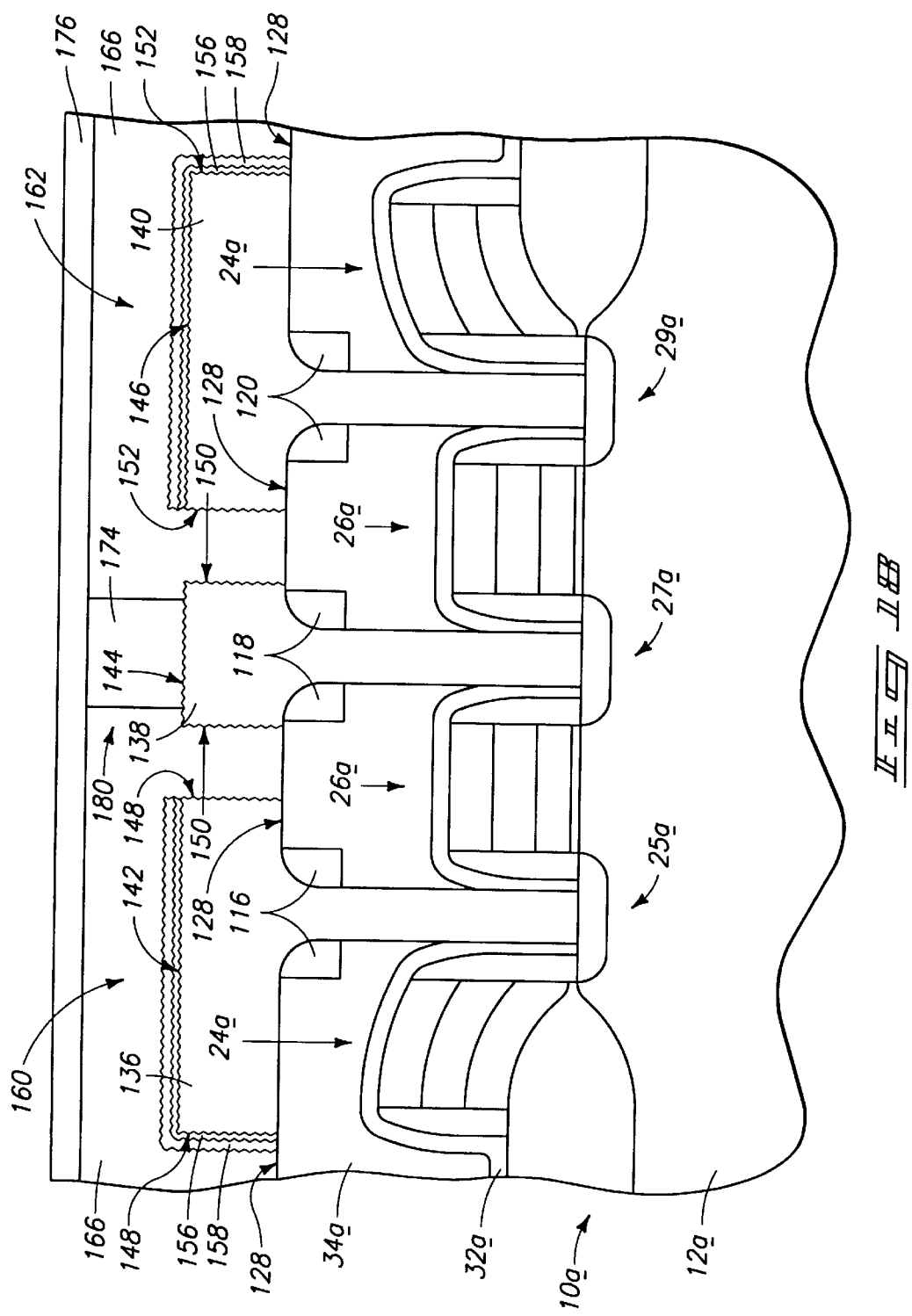
FIG. 18 is a view of the FIG. 2 wafer fragment at a processing step subsequent to that of FIG. 17.

Referring to FIG. 18, bitline plug layer 172 is removed from over insulative layer 166. Methods for removing bitline plug layer 172 from over layer 166 may include, for example, chemical mechanical planarization (CMP).

After removal of bitline plug layer 172 from over insulative layer 166, a bitline 176 is formed in electrical connection with bitline plug 174. Bitline 176 may comprise a number of materials known to persons of ordinary skill in the art, including, for example, aluminum or titanium.

The final construction of FIG. 18 is a DRAM array comprising a first node location 25a, a second node location 27a, and a third node location 29a. Node locations 25a, 27a and 29a are diffusion regions within a substrate 12a. Node locations 25a and 27a are electrically coupled through a transistor gate of a wordline 26a. Similarly, node locations 27a and 29a are electrically coupled through a transistor gate of a wordline 26a. An insulative layer 34a is over substrate 12a and comprises an uppermost surface 128. First, second and third conductive pedestals 136, 138 and 140, respectively, extend through insulative material 34a and in electrical connection with first, second and third node locations 25a, 27a and 29a, respectively.

Conductive pedestals 136, 138 and 140 comprise uppermost surfaces 142, 144 and 146, respectively, and comprise lateral surfaces 148, 150 and 152, respectively. Uppermost surfaces 142, 144 and 146 are at a substantially common elevational height relative to one another, and are above uppermost surface 128 of insulative material layer 34a.

A dielectric layer 156 and a cell plate layer 158 are adjacent uppermost surfaces 142 and 146 of pedestals 136 and 140. Dielectric layer 156 and cell plate layer 158 are also adjacent lateral surfaces 148 and 152 of pedestals 136 and 140. Together, pedestal 136, dielectric layer 156 and cell plate layer 158 comprise a first capacitor construction 160.

Similarly, third pedestal 140, together with dielectric layer 156 and cell plate layer 158 comprises a second capacitor construction 162. First capacitor construction 160 and second capacitor construction 162 are connected to pedestal 138 through wordlines 26a. Pedestal 138 is connected to a bitline 176 through a bitline plug 174. Accordingly, pedestal 138 and bitline plug 174 together comprise a bitline contact 180. The DRAM array of FIG. 18 may be incorporated into monolithic integrated circuitry, such as microprocessor circuitry.

To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other material they are on), and semiconductive material layers (either alone or in assemblies comprising other materials. The term "substrate" refers to any supporting structure, including, but not limited to, the semiconductive substrates described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted and in accordance with the doctrine of equivalents.

We claim:

1. An integrated circuit element comprising:
   a first node location and a second node location within a semiconductor substrate;
   a transistor gate electrically connecting the first and second node locations;
   an insulative material layer over the semiconductor substrate, the insulative material layer comprising an uppermost surface; and
   a first conductive pedestal extending through the insulative material layer to connect with the first node location; a second conductive pedestal extending through the insulative material layer to connect with the second node location; the conductive pedestals comprising uppermost surfaces, the uppermost surfaces of the first and second conductive pedestals being substantially at a common elevational height relative to one another and being above the uppermost surface of the insulative material layer in a region about the conductive pedestals.

2. An integrated circuit element comprising:
   a first node location, a second node location, and a third node location within a semiconductor substrate;
   a first transistor gate electrically connecting the first and second node locations;
   a second transistor gate electrically connecting the second and third node locations;
   an insulative material layer over the semiconductor substrate, the insulative material layer having an uppermost surface; and
   a first conductive pedestal extending through the insulative material layer to connect with the first node location; a second conductive pedestal extending through the insulative material layer to connect with the second node location; a third conductive pedestal extending through the insulative material layer to connect with the third node location, the conductive pedestals comprising uppermost surfaces, the uppermost surfaces of the first, second and third conductive pedestals being substantially at a common elevational height relative one another and being above the uppermost surface of the insulative material layer in a region about the conductive pedestals.

3. A DRAM cell comprising:

a first node location and a second node location within a semiconductor substrate;

a transistor gate electrically connecting the first and second node locations;

an insulative material layer over the semiconductor substrate, the insulative material layer comprising an uppermost surface;

a first conductive pedestal extending through the insulative material layer to connect with the first node location; a second conductive pedestal extending through the insulative material layer to connect with the second node location; the conductive pedestals comprising uppermost surfaces, the uppermost surfaces of the first and second conductive pedestals being substantially at a common elevational height relative to one another and being above the uppermost surface of the insulative material layer in a region about the conductive pedestals;

a dielectric layer proximate the first pedestal;

a cell plate layer proximate the dielectric layer, the first pedestal together with the dielectric layer and cell plate layer comprising a capacitor; and a bitline in electrical contact with the second pedestal.

4. A DRAM array comprising:

a first node location, a second node location, and a third node location within a semiconductor substrate;

a first transistor gate electrically connecting the first and second. node locations;

a second transistor gate electrically connecting the second and third node locations;

an insulative material layer over the semiconductor substrate, the insulative material layer having an uppermost surface;

a first conductive pedestal extending through the insulative material layer to connect with the first node location; a second conductive pedestal extending through the insulative material layer to connect with the second node location; a third conductive pedestal extending through the insulative material layer to connect with the third node location, the conductive pedestals having uppermost surfaces, the uppermost surfaces of the first, second and third conductive pedestals being substantially at a common elevational height relative to one another and being above the uppermost surface of the insulative material layer in a region about the conductive pedestals;

a dielectric layer adjacent the uppermost surfaces of the first and third conductive pedestals;

a cell plate layer adjacent the dielectric layer, the first pedestal together with the dielectric layer and cell plate layer comprising a first capacitor, the third pedestal together with the dielectric layer and cell plate layer comprising a second capacitor; and a bitline in electrical contact with the second pedestal.

5. The DRAM array of claim 4 wherein the conductive pedestals comprise polysilicon.

6. The DRAM array of claim 4 wherein the bitline extends above the first and second capacitors.

7. A monolithic integrated circuit comprising:

fabricated circuitry over a semiconductor substrate, the integrated circuitry comprising elements including transistors, capacitors and resistive elements;

at least one of the integrated circuitry elements comprising:

a first node location and a second node location within a semiconductor substrate;

a transistor gate electrically connecting the first and second node locations;

an insulative material layer over the semiconductor substrate, the insulative material layer comprising an uppermost surface; and a first conductive pedestal extending through the insulative material layer to connect with the first node location; a second conductive pedestal extending through the insulative material layer to connect with the second node location; the conductive pedestals comprising uppermost surfaces, the uppermost surfaces of the first and second conductive pedestals being substantially at a common elevational height relative to one another and being above the uppermost surface of the insulative material layer in a region about the conductive pedestals.

8. The monolithic integrated circuit of claim 7 wherein the integrated circuit is part of a microprocessor circuit.

9. The monolithic integrated circuit of claim 7 wherein the integrated circuit is part of a microprocessor circuit and wherein the first and second conductive pedestals are incorporated into a DRAM cell.

* * * * *

UNITED STATES PATENT AND TRADEMARK OFFICE
CERTIFICATE OF CORRECTION

PATENT NO : 6,005,268
DATED : December 21, 1999
INVENTOR(S) : Kunal R. Parekh et al.

It is certified that error appears in the above-identified patent and that said Letters Patent are hereby corrected as shown below:

Col. 1, line 58
 replace "55"
 with --56--.

Col. 4, line 37
 replace "second occurrence of "X""
 with --"Y"--.

Col. 4, line 50
 replace "offer"
 with --over--.

Col. 5, line 50
 replace "latter"
 with --layer--.

Col. 6, line 19
 replace "BPS(G"
 with --BPSG--.

Col. 7, line 5
 replace "arid"
 with --and--.

Col. 9, line 5
 replace "relative"
 with --relative to--.

Signed and Sealed this

First Day of May, 2001

NICHOLAS P. GODICI

Attest:

Attesting Officer

Acting Director of the United States Patent and Trademark Office